US012812976B2

(12) United States Patent
Chen

(10) Patent No.: US 12,812,976 B2
(45) Date of Patent: Nov. 24, 2026

(54) ELECTRONIC DEVICE

(71) Applicant: ULTRA DISPLAY TECHNOLOGY CORP., Taipei City (TW)

(72) Inventor: Hsien-Te Chen, Taipei City (TW)

(73) Assignee: ULTRA DISPLAY TECHNOLOGY CORP., Taipei City (TW)

( * ) Notice: Subject to any disclaimer, the term of this patent is extended or adjusted under 35 U.S.C. 154(b) by 343 days.

(21) Appl. No.: 18/631,546

(22) Filed: Apr. 10, 2024

(65) Prior Publication Data

US 2024/0347544 A1 Oct. 17, 2024

Related U.S. Application Data

(60) Provisional application No. 63/459,047, filed on Apr. 13, 2023.

(51) Int. Cl.

| | |
|---|---|
| ***H10D 86/60*** | (2025.01) |
| ***H10D 86/40*** | (2025.01) |
| ***H10W 70/60*** | (2026.01) |
| ***H10W 70/63*** | (2026.01) |
| ***H10W 72/00*** | (2026.01) |
| ***H10W 90/00*** | (2026.01) |

(52) U.S. Cl.
CPC ........... *H10D 86/60* (2025.01); *H10D 86/441* (2025.01); *H10W 70/611* (2026.01); *H10W 70/635* (2026.01); *H10W 72/00* (2026.01); *H10W 90/00* (2026.01)

(58) Field of Classification Search
CPC . H10W 70/611; H10W 70/635; H10W 72/00; H10W 90/00; H10D 86/60; H10D 86/441; G09G 3/32
See application file for complete search history.

(56) References Cited

U.S. PATENT DOCUMENTS

2022/0140021 A1* 5/2022 Li ........................ H10K 59/131 257/40

* cited by examiner

*Primary Examiner* — Moazzam Hossain
(74) *Attorney, Agent, or Firm* — MUNCY, GEISSLER, OLDS & LOWE, P.C.

(57) ABSTRACT

An electronic device includes a substrate, a plurality of functional units, a wiring unit and a plurality of conductive members. The substrate has a first surface and a second surface opposite to the first surface. The functional units are defined on the first surface of the substrate, and each functional unit includes one or more semiconductor components. The wiring unit is arranged on the second surface of the substrate. The wiring unit includes a plurality of circuits, and the circuits are provided corresponding to the functional units. The conductive members are arranged corresponding to the circuits, and each conductive member electrically connects the semiconductor component(s) of one corresponding functional unit to the corresponding circuit of the wiring unit. The semiconductor component(s) of the corresponding functional unit and the corresponding circuit of the wiring unit are at least partially overlapped.

15 Claims, 3 Drawing Sheets

ELECTRONIC DEVICE

CROSS REFERENCE TO RELATED APPLICATIONS

The non-provisional patent application claims priority to U.S. provisional patent application with Ser. No. 63/459,047 filed on Apr. 13, 2023. This and all other extrinsic materials discussed herein are incorporated by reference in their entirety.

BACKGROUND

Technology Field

This disclosure relates to an electronic device and, in particular, to an electronic device with a larger aperture ratio.

Description of Related Art

Electronic devices have continued to develop with the advancement of sciences and technologies. For example, the display devices have been evolved from the conventional black-and-white display devices and color display devices to high-definition display devices and curved display devices. While display technology continues to advance, it also meets user's increasingly stringent needs for displaying. For example, a new type of display technology is related to a non-opaque display, which is considered as an important part of next-generation display technology. The non-opaque display technology may accomplish the application of providing the information behind the display device while viewing the content displayed on the display device itself, which is a difficult task to the conventional display technology.

SUMMARY

One or more exemplary embodiments of this disclosure are to provide an electronic device, which has a larger aperture ratio.

An electronic device of one exemplary embodiment includes an electronic device, which includes a substrate, a plurality of functional units, a wiring unit and a plurality of conductive members. The substrate has a first surface and a second surface opposite to the first surface. The functional units are defined on the first surface of the substrate, and each of the functional units includes one or more semiconductor components. The wiring unit is arranged on the second surface of the substrate. The wiring unit includes a plurality of circuits, and the circuits are provided corresponding to the functional units. The conductive members are arranged corresponding to the circuits. Each of the conductive members electrically connects the one or more semiconductor components of a corresponding one of the functional units to a corresponding one of the circuits of the wiring unit. The one or more semiconductor components of the corresponding functional unit and the corresponding circuit of the wiring unit are at least partially overlapped.

In one exemplary embodiment, the substrate is a non-opaque substrate.

In one exemplary embodiment, the substrate is a resilient substrate.

In one exemplary embodiment, the substrate is made of polyimide (PI), polyethylene terephthalate (PET), flexible glass or a material containing at least one of the above-mentioned materials.

In one exemplary embodiment, the substrate is a multi-layer substrate.

In one exemplary embodiment, the substrate includes a first board and a second board jointing with each other, the first board has the first surface and a first interior surface opposite to the first surface, the second board has the second surface and a second interior surface opposite to the second surface, the semiconductor components are formed on the first surface of the first board, the wiring unit is formed on the second surface of the second board, and the first interior surface of the first board and the second interior surface of the second board are jointed with each other in a face-to-face manner.

In one exemplary embodiment, each of the semiconductor components includes a lighting component, an antenna, or a sensor.

In one exemplary embodiment, one of the circuits includes an integrated circuit.

In one exemplary embodiment, the integrated circuit includes a thin-film transistor or a crystalline silicon (c-Si) component.

In one exemplary embodiment, each of the conductive members includes a conductive via formed through the substrate.

In one exemplary embodiment, each of the conductive members and the one or more semiconductor components of the electrically connected functional unit are at least partially overlapped.

In one exemplary embodiment, each of the conductive members and the corresponding circuit of the electrically connected wiring unit are at least partially overlapped.

In one exemplary embodiment, the one or more semiconductor components of the corresponding functional unit and the corresponding circuit of the wiring unit are fully overlapped.

In one exemplary embodiment, the first surface is defined with an active area, and the functional units or the semiconductor components are provided in the active area.

In one exemplary embodiment, the electronic device further includes a control circuit electrically connected to the circuits of the wiring unit. The first surface is further defined with a non-active area located adjacent to the active area, and the control circuit is provided on the second surface and located corresponding to the non-active area.

As mentioned above, in the electronic device of this disclosure, the functional units are defined on the first surface of the substrate, each functional unit includes one or more semiconductor components, the wiring unit is arranged on the second surface of the substrate and includes a plurality of circuits provided corresponding to the functional units, the conductive members are arranged corresponding to the circuits, and each conductive member electrically connects the one or more semiconductor components of a corresponding one of the functional units to a corresponding one of the circuits of the wiring unit. The one or more semiconductor components of the corresponding functional unit and the corresponding circuit of the wiring unit are at least partially overlapped. Based on this structural design, the electronic device of this disclosure can have a larger aperture ratio.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
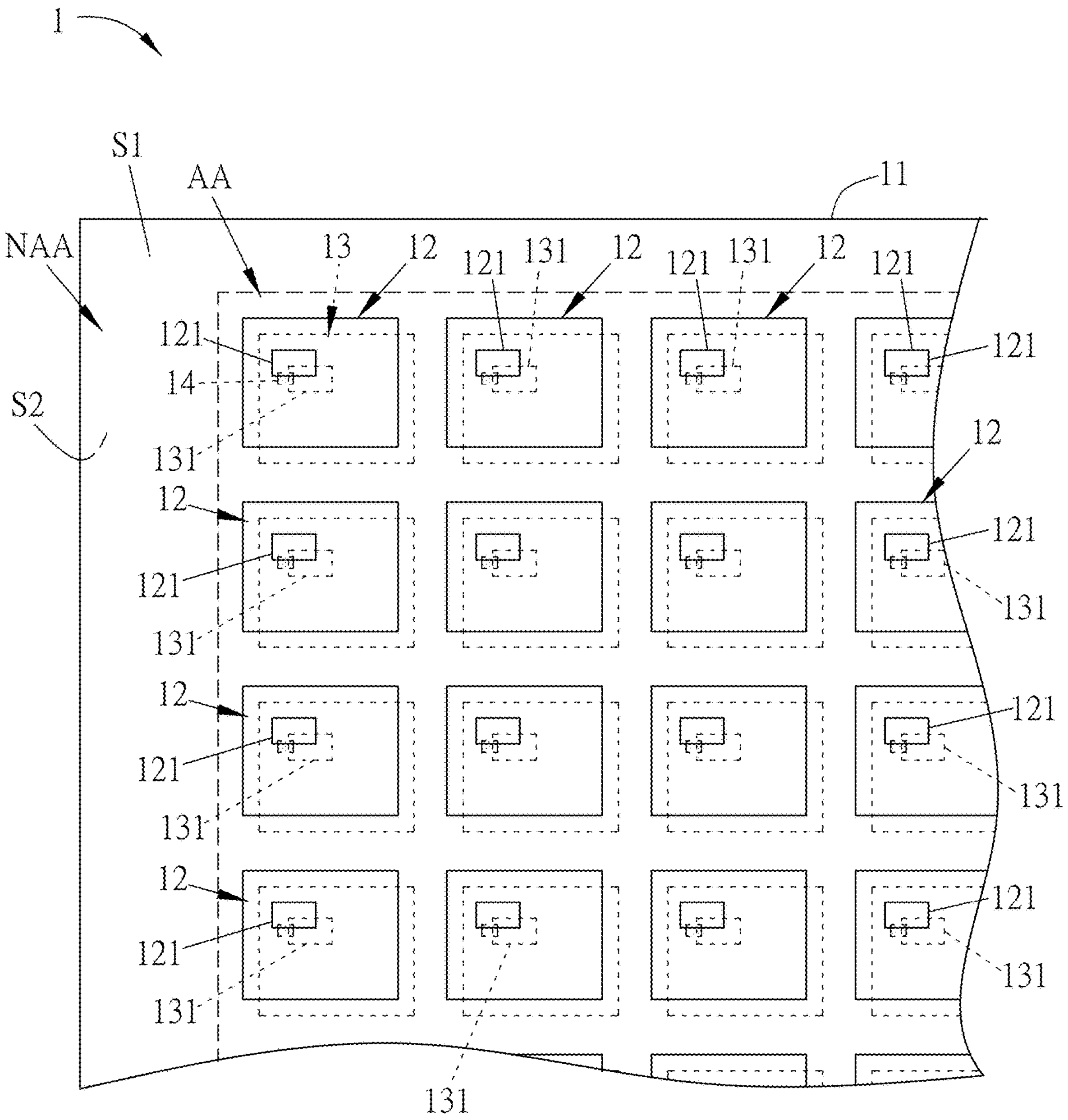
FIG. 1 is a schematic diagram showing an electronic device according to an embodiment of this disclosure.
Figure 2:
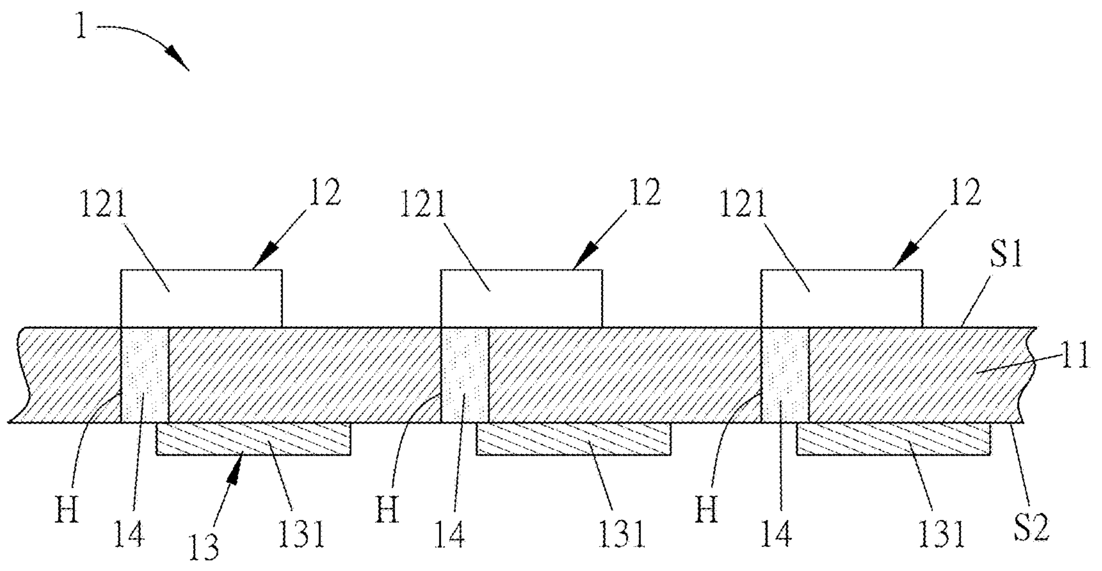
FIG. 2 is a sectional view of an electronic device according to an embodiment of this disclosure.

FIG. 1 is a schematic diagram showing an electronic device according to an embodiment of this disclosure, and FIG. 2 is a sectional view of an electronic device according to an embodiment of this disclosure.

Referring to FIGS. 1 and 2, an electronic device 1 of this embodiment includes a substrate 11, a plurality of functional units 12, a wiring unit 13, and a plurality of conductive members 14.

The substrate 11 has a first surface S1 and a second surface S2 opposite to the first surface S1. In this embodiment, the first surface S1 is defined as the upper surface of the substrate 11, and the second surface S2 is defined as the lower surface of the substrate 11. The substrate 11 can be a resilient substrate, a rigid substrate, a multi-layer substrate or a composite substrate, and the material of the substrate 11 can include, for example but not limited to, polyimide (PI), polyethylene terephthalate (PET) or flexible glass (e.g. having a thickness of equal to or less than 0.1 mm), or a substrate containing at least one of the above-mentioned materials. In this embodiment, the substrate 11 is a transparent or non-opaque resilient substrate (e.g. a PI substrate).

The functional units 12 are defined on the first surface S1 of the substrate 11, and each of the functional units 12 includes one or more semiconductor components 121. In this embodiment, the functional units 12 are defined on the first surface S1 of the substrate 11 in a two-dimensional array, and each functional unit 12 includes, for example, one semiconductor component 121. To be noted, the above configuration is for an illustration only and is not to limit this disclosure. In different embodiments, each functional unit 12 may include, for example, three semiconductor components 121. Therefore, in this embodiment, a plurality of semiconductor components 121 are arranged in a two-dimensional array on the first surface S1 of the substrate 11. In this case, the semiconductor components 121 can be manufactured by using semiconductor manufacturing processes. In one embodiment, the one or more semiconductor components 121 can be self-luminous components such as, for example but not limited to, light-emitting diodes (LEDs), Mini LEDs or Micro LEDs. In one embodiment, the one or more semiconductor components 121 can be flip-chip components (i.e., surface mount devices (SMDs)). In one embodiment, if the one or more semiconductor components 121 are self-luminous components, the electronic device can be a display device, and each functional unit 12 defined on the first surface S1 can be regarded as one display pixel. In another case, every three functional units 12 can be regarded as one display pixel. To be noted, this disclosure is not limited thereto.

In one embodiment, the first surface S1 of the substrate can be further defined with an active area AA, and the functional units 12 or the semiconductor components 121 are arranged in the active area AA. In a display device, for example, the active area AA is the area configured for displaying images. In one embodiment, each functional unit 12 may further include at least one electrical connection pad and a circuit pattern layer. The semiconductor components 121 may be bonded to the electrical connection pads, so that the semiconductor components 121 can be arranged on the first surface S1 through the electrical connection pads and circuit pattern layer. In one embodiment, each semiconductor component 121 may also include an antenna or a sensor. To be noted, this disclosure is not limited thereto.

The wiring unit 13 is arranged on the second surface S2 of the substrate 11. The wiring unit 13 includes a plurality of circuits 131, and the circuits 131 are provided corresponding to the functional units 12. In this embodiment, the circuit 131 are provided corresponding to the functional units 12 in a respective manner (or one-to-one manner). In one embodiment, the wiring unit 13 may include one or more conductive layers, one or more wires, one or more components or one or more units, or any combinations thereof for transmitting electrical signals. In one embodiment, each circuit 131 may include a driving component, an active component, a passive component, an active circuit or a passive circuit. In one embodiment, one or more circuits 131 may include an integrated circuit (IC). The integrated circuit may include an active component, such as at least one thin-film transistor (TFT) or at least one crystalline silicon (c-Si) component.

The plurality of conductive members 14 are arranged corresponding to the plurality of circuits 131. Each of the conductive members 14 electrically connects the one or more semiconductor components 121 of a corresponding functional unit 12 to a corresponding circuit 131 of the wiring unit 13. In this embodiment, the conductive members 14 are arranged corresponding to the functional units 12 (the semiconductor components 121) and the circuits 131 in, for example, a respective manner (or one-to-one manner). In addition, each conductive member 14 of this embodiment can include a conductive via H, which penetrates the substrate 11. In this case, each conductive via H communicates two surfaces of the substrate 11, and the conductive members 14 (each conductive vias H) are arranged corresponding to the functional units 12, the semiconductor components 121 and the circuits 131 in a respective manner (or one-to-one manner). Therefore, each semiconductor element 121 of the functional unit 12 can be electrically connected to the corresponding circuit 131 of the wiring unit 13 through the corresponding conductive member 14 (the conductive via H). Accordingly, the circuit 131 of the wiring unit 13 can drive the semiconductor component 121 of the corresponding functional unit 12 through the corresponding conductive member 14 (the conductive via H). In another case, each semiconductor component 121 of the functional unit 12 can transmit electrical signals to the corresponding circuit 131 of the wiring unit 13 through the corresponding conductive member 14 (the conductive via H).

In one embodiment, the width of one end of each conductive via H located at the first surface S1 of the substrate 11 can be wider than the width of the other end of the conductive via H located at the second surface S2 of the substrate 11. In one embodiment, the width of one end of each conductive via H located at the second surface S2 of the substrate 11 can be wider than the width of the other end of the conductive via H located at the first surface S1 of the substrate 11. To be noted, the shape and structure of the conductive via H are not limited in this disclosure. In one embodiment, the conductive via H connecting the first surface S1 and the second surface S2 of the substrate 11 can be formed by a laser beam. It should be noted that the above-mentioned "width" can refer to the inner diameter of the conductive via H defined on the plane parallel to the first surface S1 or the second surface S2 of the substrate 11.

In one embodiment, each conductive via H may include a conductive material. In practice, for example, the conductive material, such as silver paste, copper paste, solder, or any of other suitable conductive materials, can be disposed (e.g. fully filled) simultaneously or separately in the through hole communicating the first surface S1 and the second surface S2 so as to form the conductive via H, thereby manufacturing the conductive member 14 that can electrically connect the semiconductor component 121 of each functional unit 12 to the corresponding circuit 131 of the wiring unit 13.

In one embodiment, each conductive member 14 and the corresponding semiconductor component 121 of each functional unit 12, which are electrically connected, can be optionally at least partially overlapped with each other. In one embodiment, each conductive member 14 and the corresponding semiconductor component 121 of each functional unit 12, which are electrically connected, can be fully overlapped with each other. In one embodiment, each conductive member 14 and the corresponding circuit 131 of the electrically connected wiring unit 13 can be optionally at least partially overlapped with each other. In one embodiment, each conductive member 14 and the corresponding circuit 131 of the electrically connected wiring unit 13 can be fully overlapped with each other. In one embodiment, each conductive member 14 can be fully overlapped with the corresponding semiconductor component 121 of the electrically connected functional unit 12 and the corresponding circuit 131 of the electrically connected wiring unit 13. This disclosure is not limited thereto.

In one embodiment, the semiconductor component 121 of each functional unit 12 and the corresponding circuit 131 of the wiring unit 13 can be optionally at least partially overlapped with each other. In one embodiment, the semiconductor component 121 of each functional unit 12 and the corresponding circuit 131 of the wiring unit 13 can be fully overlapped with each other. It can be understood that "overlapped" in this disclosure refers to be overlapped in the projection direction of the substrate 11. Specifically, the projection direction refers to the direction perpendicular to the first surface S1 or the second surface S2 of the substrate 11.

To be noted, for the sake of easy understanding, as shown in FIG. 1, each functional unit 12 and each semiconductor component 121 arranged on the first surface S1 of the substrate 11 are shown with solid lines, but the corresponding circuit 131 of the wiring unit 13 arranged on the second surface S2 of the substrate 11 and corresponding to the functional unit 12 and the semiconductor component 121 is shown with dotted lines. Moreover, the semiconductor component 121 (functional unit 12) shown with solid lines and the circuit 131 (wiring unit 13) shown with dotted lines are slightly shifting relatively to each other. To be noted, this embodiment shown in FIG. 1 is for easy understanding only and is not to limit this disclosure.

In the electronic device 1 of this embodiment, when the semiconductor components 121 are lighting components, such as, for example but not limited to, LEDs, and the substrate 11 is non-opaque, the electronic device 1 can be presented as a non-opaque (transparent) display device. In order to further optimize the degree of transparency, the semiconductor component 121 of each functional unit 12 and the corresponding circuit 131 of the wiring unit 13 can be at least partially overlapped. In particularly, when the semiconductor component 121 of each functional unit 12 and the corresponding circuit 131 of the wiring unit 13 are fully overlapped, the electronic device 1 can have a larger aperture ratio.

Figure 3:
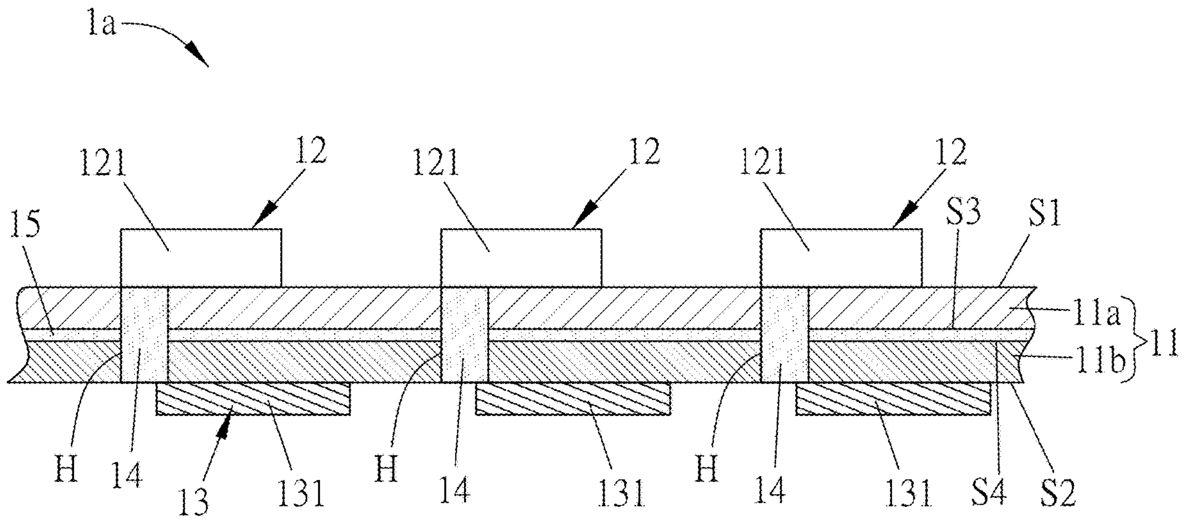
FIGS. 3 to 5 are sectional views of electronic devices according to different embodiments of this disclosure.
Figure 4:
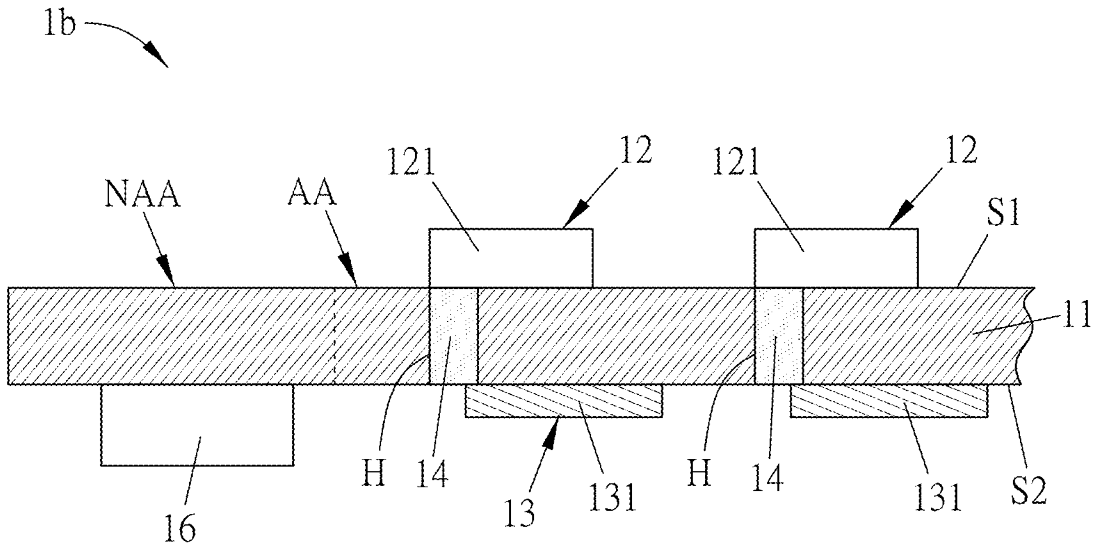
Figure 5:
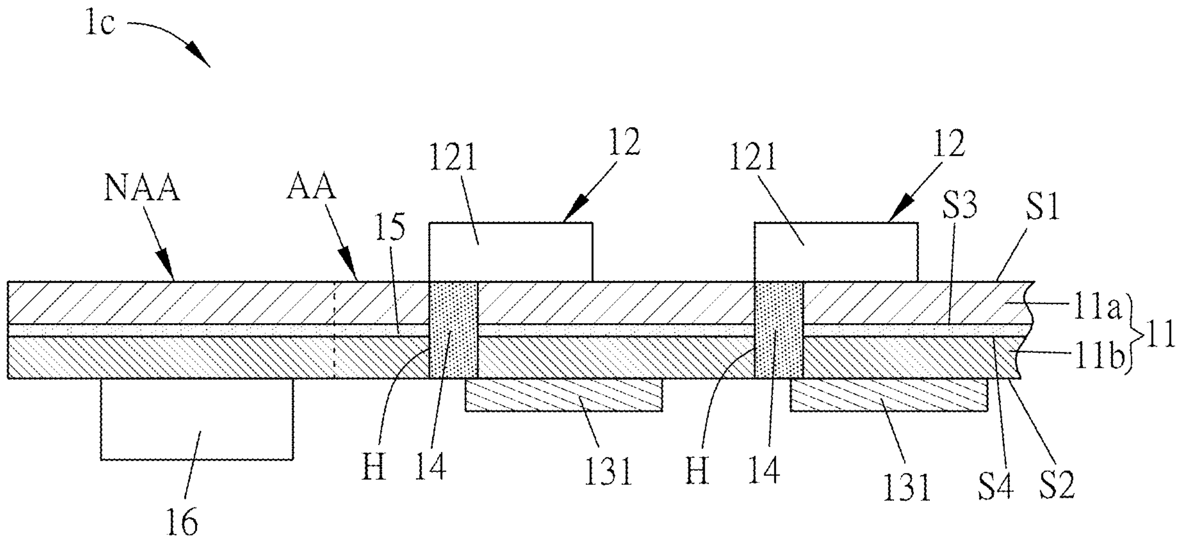

FIGS. 3 to 5 are sectional views of electronic devices according to different embodiments of this disclosure.

The component configurations and connections of an electronic device 1*a* as shown in FIG. 3 are mostly the same as those of the electronic device 1 of the previous embodiment. Unlike the electronic device 1, the substrate 11 of the electronic device 1*a* is a multi-layer substrate, which includes a first board 11*a* and a second board 11*b* jointing with each other. The first board 11*a* has the first surface S1 and a first interior surface S3 opposite to the first surface S1, and the second board 11*b* has the second surface S2 and a second interior surface S4 opposite to the second surface S2. The semiconductor components 121 are formed on the first surface S1 of the first board 11*a*, the wiring unit 13 is formed on the second surface S2 of the second board 11*b*, and the first interior surface S3 of the first board 11*a* and the second interior surface S4 of the second board 11*b* are jointed with each other in a face-to-face manner. In this embodiment, the electronic device 1*a* can further include a bonding layer 15, which is disposed between the first interior surface S3 of the first board 11*a* and the second interior surface S4 of the second board 11*b*, so that the first board 11*a* and the second board 11*b* can be connected to each other in a face-to-face manner by the bonding layer 15. The bonding layer 15 may be laid continuously or discontinuously, and this disclosure is not limited thereto. The bonding layer 15 can be an insulating adhesive, and can be made of, for example but not limited to, optical clear adhesive (OCA) or optical clear resin (OCR).

In one embodiment, the first board 11*a* or the second board 11*b* can be a resilient board or a rigid board, and the material thereof may include, for example but not limited to, polyimide (PI), polyethylene terephthalate (PET) or flexible glass, or a material containing at least one of the above-mentioned materials. In one embodiment, the first board 11*a* or the second board 11*b* may be a non-opaque resilient board.

The component configurations and connections of an electronic device 1*b* as shown in FIG. 4 are mostly the same as those of the electronic device 1*a* of the previous embodiment. Unlike the electronic device 1*a*, the electronic device 1*b* of this embodiment further includes a control circuit 16 electrically connected to the circuits 131 of the wiring unit 13. In addition, the first surface S1 of the substrate 11 is further defined with a non-active area NAA (i.e., a peripheral area) located adjacent to the active area AA, and the control circuit 16 is provided on the second surface S2 and located corresponding to the non-active area NAA. In one embodiment, the control circuit 16 can include a controller IC, which can control the semiconductor component 121 of the corresponding functional unit 12 by transmitting control signals through the corresponding circuit 131 of the wiring unit and the corresponding conductive member 14.

The component configurations and connections of an electronic device 1*c* as shown in FIG. 5 are mostly the same as those of the electronic device 1*b* of the previous embodiment. Unlike the electronic device 1*b*, the substrate 11 of the electronic device 1*c* of this embodiment includes a first board 11*a* and a second board 11*b* jointing with each other. In this case, the first board 11*a* or/and the second board 11*b* can also be a substrate. The first board 11*a* has the first surface S1 and a first interior surface S3 opposite to the first surface S1, and the second board 11*b* has the second surface S2 and a second interior surface S4 opposite to the second surface S2. The semiconductor components 121 are formed on the first surface S1 of the first board 11*a*, the wiring unit 13 is formed on the second surface S2 of the second board 11*b*, and the first interior surface S3 of the first board 11*a* and the second interior surface S4 of the second board 11*b* are jointed with each other in a face-to-face manner. In this embodiment, the first board 11*a* and the second board 11*b* can be connected to each other in a face-to-face manner by a bonding layer 15.

In summary, in the electronic device of this disclosure, the functional units are defined on the first surface of the substrate, each functional unit includes one or more semiconductor components, the wiring unit is arranged on the second surface of the substrate and includes a plurality of circuits provided corresponding to the functional units, the conductive members are arranged corresponding to the circuits, and each conductive member electrically connects the one or more semiconductor components of a corresponding one of the functional units to a corresponding one of the circuits of the wiring unit. The one or more semiconductor components of the corresponding functional unit and the corresponding circuit of the wiring unit are at least partially overlapped. Based on this structural design, the electronic device of this disclosure can have a larger aperture ratio.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:

a substrate having a first surface and a second surface opposite to the first surface;

a plurality of functional units defined on the first surface of the substrate, wherein each of the functional units comprises one or more semiconductor components;

a wiring unit arranged on the second surface of the substrate, wherein the wiring unit comprises a plurality of circuits, and the circuits are provided corresponding to the functional units; and a plurality of conductive members arranged corresponding to the circuits, wherein each of the conductive members electrically connects the one or more semiconductor components of a corresponding one of the functional units to a corresponding one of the circuits of the wiring unit;

wherein the one or more semiconductor components of the corresponding functional unit and the corresponding circuit of the wiring unit are at least partially overlapped, wherein each of the one or more semiconductor components is a flip-chip component, wherein each of the functional units further comprises at least one electrical connection pad and a circuit pattern layer, each of the one or more semiconductor components is bonded to the at least one electrical connection pad, such that each of the one or more semiconductor components is arranged on the first surface through the at least one electrical connection pad and the circuit pattern layer.

2. The electronic device of claim 1, wherein the substrate is a non-opaque substrate.

3. The electronic device of claim 1, wherein the substrate is a resilient substrate.

4. The electronic device of claim 1, wherein the substrate is made of polyimide (PI), polyethylene terephthalate (PET), flexible glass or a material containing at least one of the above-mentioned materials.

5. The electronic device of claim 1, wherein the substrate is a multi-layer substrate.

6. The electronic device of claim 5, wherein the substrate comprises a first board and a second board jointing with each other, the first board has the first surface and a first interior surface opposite to the first surface, the second board has the second surface and a second interior surface opposite to the second surface, the semiconductor components are formed on the first surface of the first board, the wiring unit is formed on the second surface of the second board, and the first interior surface of the first board and the second interior surface of the second board are jointed with each other in a face-to-face manner.

7. The electronic device of claim 1, wherein each of the semiconductor components comprises a lighting component, an antenna, or a sensor.

8. The electronic device of claim 1, wherein one of the circuits comprises an integrated circuit.

9. The electronic device of claim 8, wherein the integrated circuit comprises a thin-film transistor or a crystalline silicon (c-Si) component.

10. The electronic device of claim 1, wherein each of the conductive members comprises a conductive via formed through the substrate.

11. The electronic device of claim 10, wherein each of the conductive members and the one or more semiconductor components of the electrically connected functional unit are at least partially overlapped.

12. The electronic device of claim 10, wherein each of the conductive members and the corresponding circuit of the electrically connected wiring unit are at least partially overlapped.

13. The electronic device of claim 1, wherein the one or more semiconductor components of the corresponding functional unit and the corresponding circuit of the wiring unit are fully overlapped.

14. The electronic device of claim 1, wherein the first surface is defined with an active area, and the functional units or the semiconductor components are provided in the active area.

15. The electronic device of claim 14, further comprising:

a control circuit electrically connected to the circuits of the wiring unit;

wherein, the first surface is further defined with a non-active area located adjacent to the active area, and the control circuit is provided on the second surface and located corresponding to the non-active area.

* * * * *